US011940822B2

(12) United States Patent
Zhou et al.

(10) Patent No.: US 11,940,822 B2
(45) Date of Patent: Mar. 26, 2024

(54) SEMICONDUCTOR DEVICE INCLUDING A VOLTAGE REGULATOR AND AN INTEGRATED CIRCUIT MODULE

(71) Applicant: Taiwan Semiconductor Manufacturing Company, Ltd., Hsinchu (TW)

(72) Inventors: Haohua Zhou, Freemont, CA (US); Mei Hsu Wong, Saratoga, CA (US); Tze-Chiang Huang, Saratoga, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 5 days.

(21) Appl. No.: 17/825,028

(22) Filed: May 26, 2022

(65) Prior Publication Data
US 2022/0413527 A1    Dec. 29, 2022

Related U.S. Application Data
(60) Provisional application No. 63/214,856, filed on Jun. 25, 2021.

(51) Int. Cl.
*G05F 1/46*     (2006.01)
*H03K 5/003*    (2006.01)

(52) U.S. Cl.
CPC ............. *G05F 1/46* (2013.01); *H03K 5/003* (2013.01)

(58) Field of Classification Search
None
See application file for complete search history.

(56) References Cited

U.S. PATENT DOCUMENTS

| | | | |
|---|---|---|---|
| 8,368,457 B2* | 2/2013 | Ikenaga | G06F 1/3203 |
| | | | 327/530 |
| 9,325,242 B2* | 4/2016 | Babazadeh | H02M 3/1588 |
| 9,354,646 B2 | 5/2016 | Kim et al. | |
| 9,461,536 B2* | 10/2016 | Bizjak | H02J 7/04 |

(Continued)

FOREIGN PATENT DOCUMENTS

| | | |
|---|---|---|
| TW | 201639285 | 11/2016 |
| TW | I 599870 | 9/2017 |

OTHER PUBLICATIONS

Taiwan office action; Application No. 111123184; dated Mar. 22, 2023.

*Primary Examiner* — Thomas J. Hiltunen
(74) *Attorney, Agent, or Firm* — Jones Day

(57) ABSTRACT

A semiconductor device includes an analog voltage regulator and an integrated circuit module. The analog voltage regulator generates a regulated output voltage. The integrated circuit module generates an analog sense voltage based on the regulated output voltage and includes integrated circuit dies, a first sensor, second sensors, and a digital voltage offset controller (DVOC). The first sensor generates a digital reference voltage based on an analog reference voltage. The second voltage sensors detect voltages at predetermined locations on the integrated circuit dies. The DVOC generates a digital offset voltage substantially equal to the difference between the digital reference voltage and the voltage detected by a selected one of the second voltage sensors. The regulated output voltage is based on an unregulated input voltage, the analog sense voltage, and the digital offset voltage.

20 Claims, 14 Drawing Sheets

(56) References Cited

U.S. PATENT DOCUMENTS

| | | |
|---|---|---|
| 10,069,409 B2 * | 9/2018 | Bulzacchelli ............. G05F 1/56 |
| 10,126,766 B2 | 11/2018 | Cho et al. |
| 10,175,655 B2 * | 1/2019 | Mahajan ................... G06F 1/12 |
| 10,439,492 B1 * | 10/2019 | Hsieh ...................... H02M 3/07 |
| 11,747,842 B1 * | 9/2023 | Zlotnik .................... G05F 1/46 |
| | | 327/108 |
| 2012/0153917 A1 * | 6/2012 | Adell .................. H02M 3/1588 |
| | | 323/283 |
| 2016/0091915 A1 * | 3/2016 | Hsu .......................... G05F 3/04 |
| | | 327/540 |
| 2020/0409402 A1 | 12/2020 | Chang et al. |

\* cited by examiner

_US 11,940,822 B2_

SEMICONDUCTOR DEVICE INCLUDING A VOLTAGE REGULATOR AND AN INTEGRATED CIRCUIT MODULE

CROSS-REFERENCE TO RELATED APPLICATION

This application claims priority to U.S. Provisional Application No. 63/214,856, filed Jun. 25, 2021, the contents of which are incorporated herein by reference in its entirety.

BACKGROUND

A power supply provides a supply voltage to an integrated circuit through a power grid. A voltage drop in metal wires of the power grid before the supply voltage reaches the integrated circuit may be referred to as static IR drop. Static IR drop may result in unsatisfactory performance of the integrated circuit.

BRIEF DESCRIPTION OF THE DRAWINGS

Aspects of the present disclosure are best understood from the following detailed description when read with the accompanying figures.

DETAILED DESCRIPTION

Figure 1:
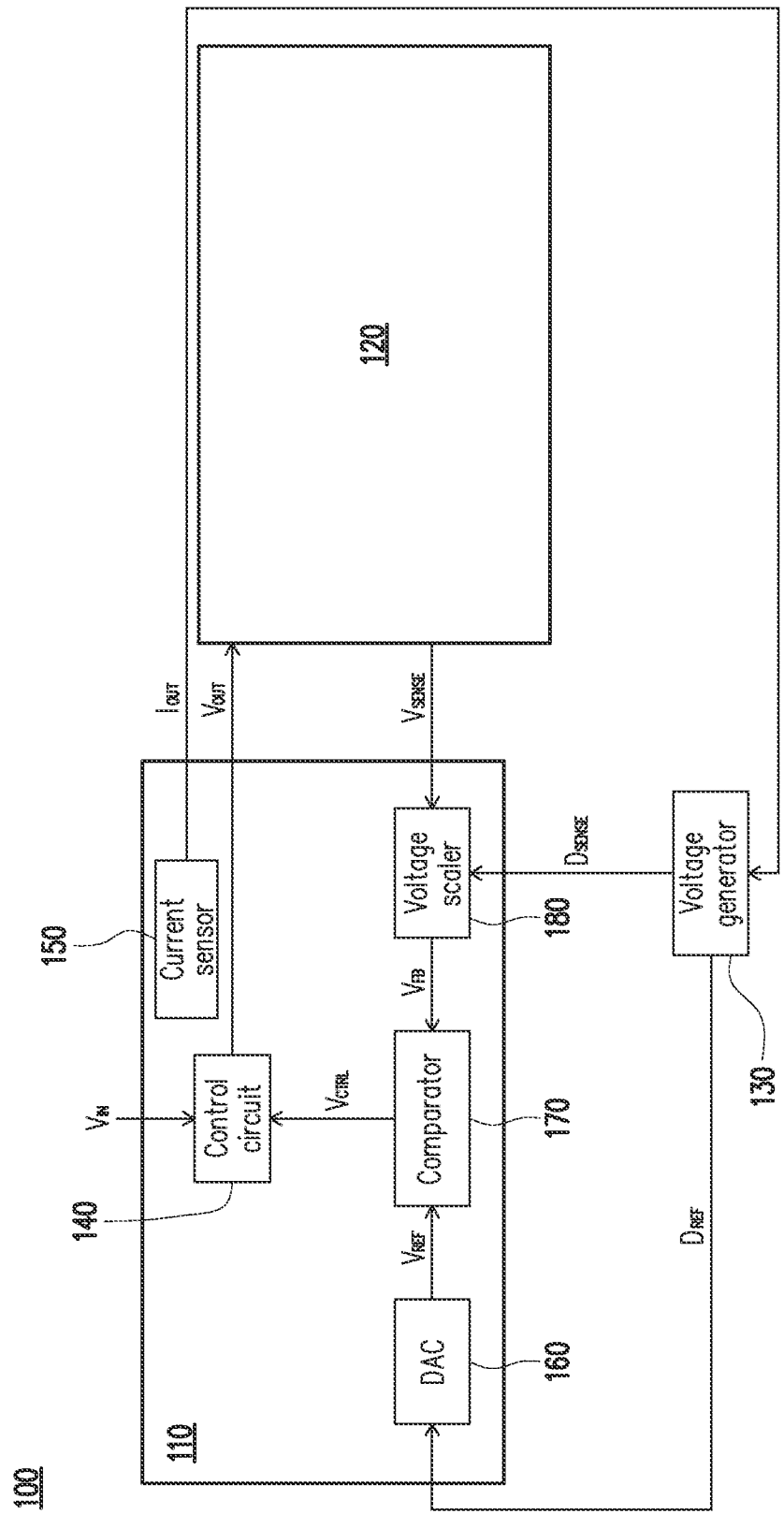
FIG. 1 is a schematic diagram illustrating an exemplary semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A power supply provides a supply voltage to an integrated circuit through a power grid. A voltage drop in metal wires of the power grid before the supply voltage reaches the integrated circuit may be referred to as static IR drop. Static IR drop is dependent on the resistance of the metal wires. For example, the integrated circuit may have a load resistance of 10 Ohms and the metal wires may have a wire resistance of 0.2 Ohms, which is 2% of the load resistance. As such, 2% of the supply voltage is lost in the metal wires itself. Static IR drop may result in unsatisfactory performance of the integrated circuit. The decrease in features sizes of integrated circuits, resulting in thinner and thus in higher resistance of metal wires of a power grid, and the increase in number of integrated circuit dies, e.g., in three-dimensional integrated circuit (3DIC), may cause aggravation of static IR drop.

Systems and methods, in some embodiments, as described herein address static IR drop by providing an analog voltage regulator, e.g., analog voltage regulator 110 in FIG. 1, that outputs a regulated output voltage, e.g., regulated output voltage ($V_{OUT}$), to an integrated circuit module, e.g., integrated circuit module 120, based on feedback, e.g., an analog sense voltage ($V_{SENSE}$), from the integrated circuit module 120. The integrated circuit module 120 may further include a plurality of voltage sensors, e.g., voltage sensors (S1-Sn) in FIG. 2, that detect voltages at predetermined locations on the integrated circuit module 120. The regulated output voltage ($V_{OUT}$) is based further on the voltage detected by a selected one of the voltage sensors (S1-Sn).

In further detail, FIG. 1 is a schematic diagram illustrating an exemplary semiconductor device 100 in accordance with various embodiments of the present disclosure. As illustrated in FIG. 1, the semiconductor device 100 includes a voltage regulator 110, an integrated circuit module 120, and a voltage generator 130. The voltage regulator 110 receives an unregulated input voltage ($V_{IN}$) and generates a regulated output voltage ($V_{OUT}$). The integrated circuit module 120 is connected across the voltage regulator 110 and receives the regulated output voltage ($V_{OUT}$) from the voltage regulator 110. The voltage regulator 110 maintains the regulated output voltage ($V_{OUT}$) substantially constant regardless of variations in the unregulated input voltage ($V_{IN}$) and in a load current of the integrated circuit module 120. For example, the voltage regulator 110 is an analog voltage regulator and includes a control circuit 140, a current sensor 150, a digital-to-analog converter (DAC) 160, a comparator 170, and a voltage scaler 180.

The control circuit 140 receives the unregulated input voltage ($V_{IN}$), e.g., from a voltage source included in or external to the semiconductor device 100, and a control voltage ($V_{CTRL}$) from the comparator 170, and generates the regulated output voltage ($V_{OUT}$) based on the unregulated input voltage ($V_{IN}$) and the control voltage ($V_{CTRL}$) received thereby. For example, in some embodiments, the control circuit 140 includes a transistor, e.g., a power field-effect transistor (FET). In such some embodiments, the control circuit 140 receives the unregulated input voltage ($V_{IN}$) at the first source/drain terminal thereof, receives the control voltage ($V_{CTRL}$) at the gate terminal thereof, and outputs the regulated output voltage ($V_{OUT}$) at the second source/drain terminal thereof. Other configurations for the control circuit 140 are usable in further embodiments.

The integrated circuit module 120 detects a voltage at a predetermined location thereon and outputs the voltage detected thereby as an analog sense voltage ($V_{SENSE}$). In some embodiments, the integrated circuit module 120 is a two-dimensional integrated circuit (2DIC) module, e.g., System on a Chip (SoC). Other configurations for the integrated circuit module 120 are usable in further embodiments. The integrated circuit module 120 includes one or more integrated circuit dies. Examples of integrated circuit dies include, but are not limited to, a central processing unit (CPU), a graphic processing unit (GPU), a signal processing unit, any suitable processing unit, a static random access memory (SRAM) device, a dynamic random access memory (DRAM) device, and any suitable memory device.

The current sensor 150 detects a current at a predetermined location on the analog voltage regulator 110 and outputs the current detected thereby as an output current ($I_{OUT}$). In certain embodiments, the current sensor 150 includes a sense resistor and sense amplifier. The sense resistor is connected between a load and an electrical ground. The sense amplifier has a non-inverting input connected to a node between the load and the sense resistor and an inverting input connected to a node between the resistor and the electrical ground. Other configurations for the current sensor 150 are usable in further embodiments.

The voltage generator 130 receives the output current ($I_{OUT}$) from the current sensor 150 and converts the current ($I_{OUT}$) received thereby into a digital sense voltage ($D_{SENSE}$). In certain embodiments, the voltage generator 130 constitutes a power management unit (PMU) of the semiconductor device 100.

The voltage scaler 180 receives the analog sense voltage ($V_{SENSE}$) from the integrated circuit module 120 and the digital sense voltage ($D_{SENSE}$) from the voltage generator 130 and generates a feedback voltage ($V_{FB}$) based on the analog sense voltage ($V_{SENSE}$) and the digital sense voltage ($D_{SENSE}$) received thereby. For example, the feedback voltage ($V_{FB}$) may be a fraction of the analog sense voltage ($V_{SENSE}$).

The voltage generator 130 further generates a predetermined digital reference voltage ($D_{REF}$). The DAC 160 receives the predetermined digital reference voltage ($D_{REF}$) from the voltage generator 130 and converts the predetermined digital reference voltage ($D_{REF}$) received thereby into an analog reference voltage ($V_{REF}$). In certain embodiments, the DAC 160 includes an operational amplifier, a plurality of resistors, and a plurality of switches. The operational amplifier has a non-inverting input connected to the electrical ground. Each resistor has a first resistor terminal connected to the inverting input of the operational amplifier. Each switch has a first switch terminal that is connected to a second resistor terminal of a respective resistor, a second switch terminal that is connected to the electrical ground, and a third switch terminal that receives the predetermined digital reference voltage ($D_{REF}$). The operational amplifier has an output terminal connected to the comparator 170. Other configurations for the DAC 160 are usable in further embodiments.

The comparator 170 receives the feedback voltage ($V_{FB}$) from the voltage scaler 180 and the analog reference voltage ($V_{REF}$) from the DAC 160 and generates the control voltage ($V_{CTRL}$) based on the feedback voltage ($V_{FB}$) and the analog reference voltage ($V_{REF}$) received thereby. For example, the control voltage ($V_{CTRL}$) is substantially equal to the difference between the feedback voltage ($V_{FB}$) and the analog reference voltage ($V_{REF}$). The control voltage ($V_{CTRL}$) is adjusted until the feedback voltage ($V_{FB}$) and the analog reference voltage ($V_{REF}$) are substantially equal. In certain embodiments, the comparator 170 includes an error amplifier. The error amplifier has a non-inverting terminal that receives the analog reference voltage ($V_{REF}$) from the DAC 160, an inverting terminal that receives the feedback voltage ($V_{FB}$) from the voltage scaler 180, and an output terminal connected to the control circuit 140. Other configurations for the comparator 170 are usable in further embodiments.

From the above, when the regulated output voltage ($V_{OUT}$) tends to increase, the voltage scaler 180 outputs a lower feedback voltage ($V_{FB}$). The comparator 170 compares the feedback voltage ($V_{FB}$) with the analog reference voltage ($V_{REF}$) and outputs a control voltage ($V_{CTRL}$) that causes the control circuit 140 to decrease the regulated output voltage ($V_{OUT}$). On the other hand, when the regulated output voltage ($V_{OUT}$) tends to decrease, the voltage scaler 180 outputs a higher feedback voltage ($V_{FB}$). The comparator 170 compares the feedback voltage ($V_{FB}$) with the analog reference voltage ($V_{REF}$) and outputs a control voltage ($V_{CTRL}$) that causes the control circuit 140 to increase the regulated output voltage ($V_{OUT}$).

Figure 2:
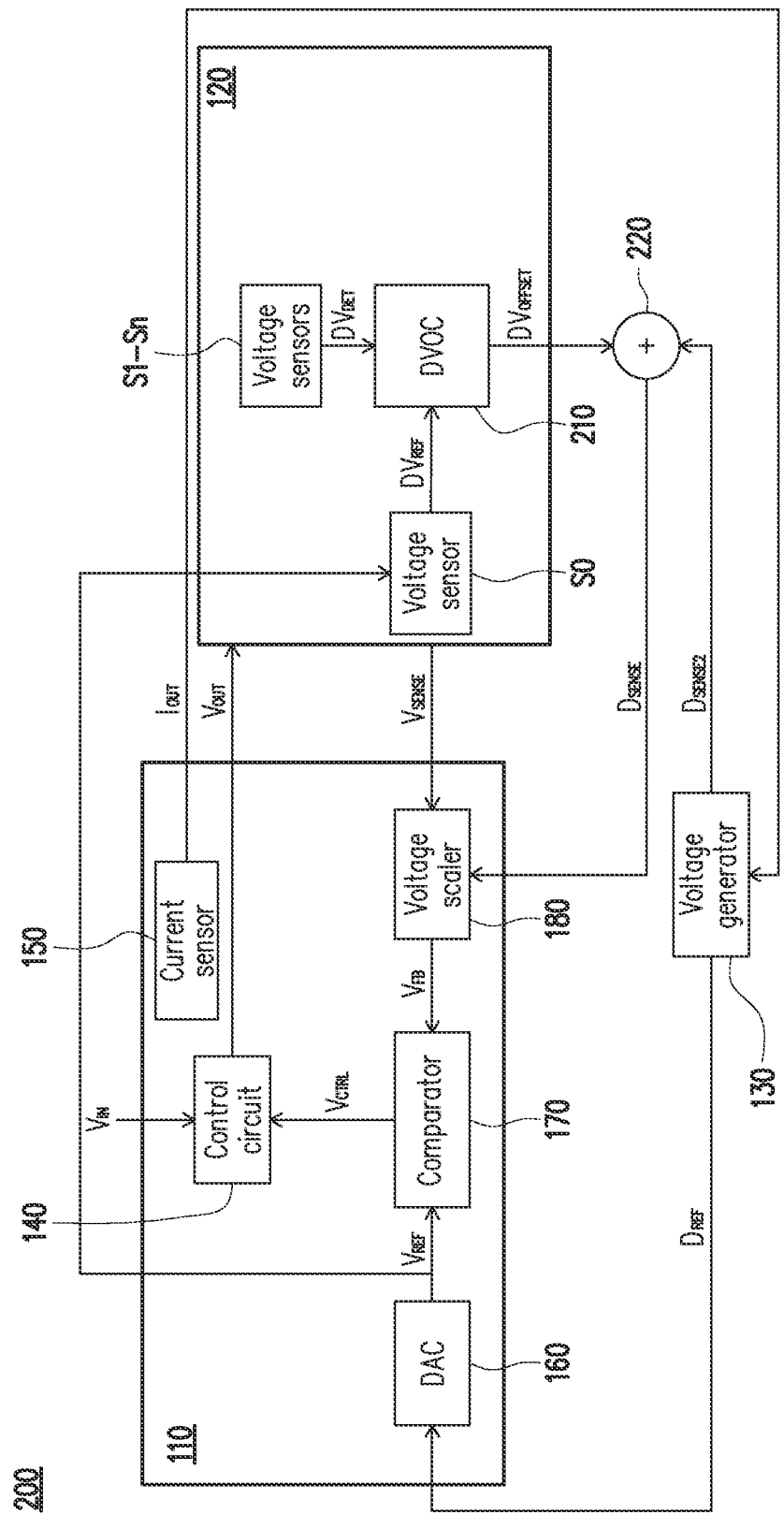
FIG. 2 is a schematic diagram illustrating another exemplary semiconductor device in accordance with various embodiments of the present disclosure.

FIG. 2 is a schematic diagram illustrating another exemplary semiconductor device 200 in accordance with various embodiments of the present disclosure. As illustrated in FIG. 2, the semiconductor device 200 of this embodiment differs from the semiconductor device 100 in that the integrated circuit module 120 includes a voltage sensor (S0), a plurality of voltage sensors (S1-Sn), and a digital voltage offset controller (DVOC) 210. In this exemplary embodiment, the integrated circuit module 120 is a 3DIC module and includes a plurality of integrated circuit dies, e.g., integrated circuit dies (D0-Dn) in FIG. 3. Examples of integrate circuit dies (D0-Dn) include, but are not limited to, a CPU, a GPU, a signal processing unit, any suitable processing unit, a SRAM device, a DRAM device, and any suitable memory device.

The voltage sensor (S0) receives the analog reference voltage ($V_{REF}$) from the DAC 160 and converts the analog reference voltage ($V_{REF}$) received thereby into a digital reference voltage ($DV_{REF}$).

The voltage sensors (S1-Sn) detect voltages at predetermined locations on the integrated circuit dies (D0-Dn). The DVOC 210 receives the digital reference voltage ($DV_{REF}$) from the voltage sensor (S0) and the voltage ($DV_{DET}$) detected by a selected one of the voltage sensors (S1-Sn) and generates a digital offset voltage ($DV_{OFFSET}$) based on the digital reference voltage ($DV_{REF}$) and the voltage ($DV_{DET}$) received thereby. For example, the digital offset voltage ($DV_{OFFSET}$) is substantially equal to the difference between the digital reference voltage ($DV_{REF}$) and the voltage ($DV_{DET}$).

The voltage generator 130 receives the output current ($I_{OUT}$) from the current sensor 150 and converts the output current ($I_{OUT}$) received thereby into a digital sense voltage ($D_{SENSE2}$).

The semiconductor device 200 further includes an adder circuit 220 that receives the digital offset voltage ($DV_{OFFSET}$) from the DVOC 210 and the digital sense voltage ($D_{SENSE2}$) from the voltage generator 130. The adder circuit 220 generates a digital sense voltage ($D_{SENSE}$) based on the digital offset voltage ($DV_{OFFSET}$) and the digital sense voltage ($D_{SENSE2}$) received thereby. For example, the digital sense voltage ($D_{SENSE}$) is substantially equal to the sum of the digital offset voltage ($DV_{OFFSET}$) and the digital sense voltage ($D_{SENSE2}$).

The voltage scaler 180 receives the analog sense voltage ($V_{SENSE}$) from the integrated circuit module 120 and the digital sense voltage ($D_{SENSE}$) from the adder circuit 220 and generates a feedback voltage ($V_{FB}$) based on the analog sense voltage ($V_{SENSE}$) and the digital sense voltage ($D_{SENSE}$) received thereby. The feedback voltage ($V_{FB}$) may be a fraction of the analog sense voltage ($V_{SENSE}$). The voltage generator 130 further generates a predetermined digital reference voltage ($D_{REF}$). In one or more embodiments, the predetermined digital reference voltage ($D_{REF}$) is substantially equal to the digital reference voltage ($DV_{REF}$). The DAC 160 receives the predetermined digital reference voltage ($D_{REF}$) from the voltage generator 130 and converts the predetermined digital reference voltage ($D_{REF}$) received thereby into an analog reference voltage ($V_{REF}$). The comparator 170 receives the feedback voltage ($V_{FB}$) from the voltage scaler 180 and the analog reference voltage ($V_{REF}$) from the DAC 160 and generates the control voltage ($V_{CTRL}$) based on the feedback voltage ($V_{FB}$) and the analog reference voltage ($V_{REF}$) received thereby. For example, the control voltage ($V_{CTRL}$) is substantially equal to the difference between the feedback voltage ($V_{FB}$) and the analog reference voltage ($V_{REF}$). The control voltage ($V_{CTRL}$) is adjusted until the feedback voltage ($V_{FB}$) and the analog reference voltage ($V_{REF}$) are substantially equal.

Figure 3:
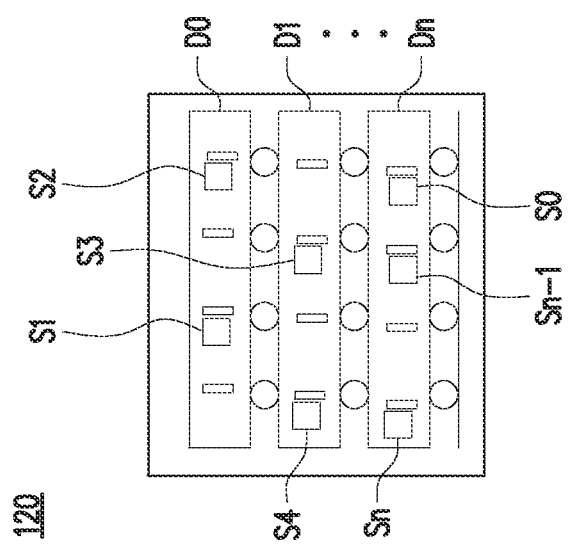
FIG. 3 is a schematic cross-sectional view illustrating an exemplary integrated circuit module in accordance with various embodiments of the present disclosure.

FIG. 3 is a schematic cross-sectional view of an exemplary integrated circuit module 120 of the semiconductor device 200 in accordance with various embodiments of the present disclosure. As illustrated in FIG. 3, the integrated circuit module 120 includes a plurality of integrated circuit dies (D0-Dn). The integrated circuit dies (D0-Dn) are stacked one above the other and may be interconnected vertically, e.g., via through-silicon vias (TSVs). The voltage sensors (S0-Sn) are disposed at predetermined locations on the integrated circuit dies (D0-Dn).

Figure 4:
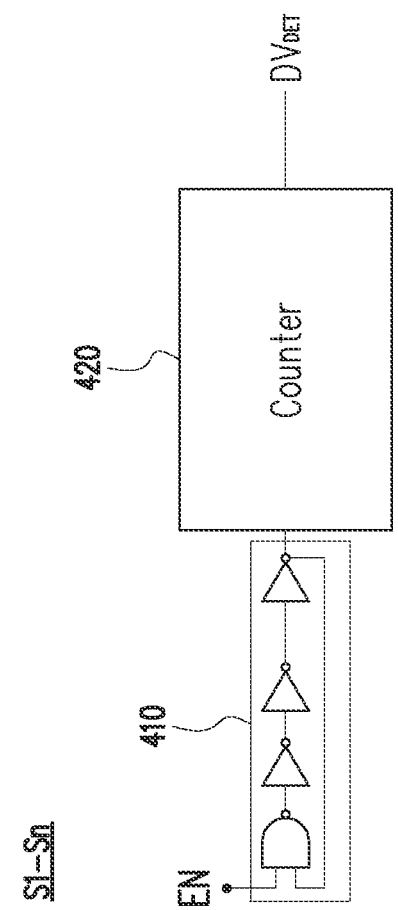
FIG. 4 is a schematic diagram illustrating an exemplary voltage sensor in accordance with various embodiments of the present disclosure.

Example supporting circuitry for the voltage sensor (S0-Sn) is depicted in FIG. 4. It is understood that this circuitry is provided by way of example, not by limitation, and other suitable voltage sensor (S0-Sn) circuitry are within the scope of the present disclosure. FIG. 4 is a schematic diagram illustrating an exemplary voltage sensor (S0-Sn) in accordance with various embodiments of the present disclosure. As illustrated in FIG. 4, the voltage sensor (S0-Sn) includes a ring oscillator 410 and a counter 420. The ring oscillator 410 includes an AND gate and a plurality of inverters. The AND gate and the inverters are connected in a loop. For example, the inverters are connected in series, an output terminal of the AND gate is connected to an input terminal of the first inverter in the series, and a first input terminal of the AND gate is connected to the output terminal of the last inverter in the series. The counter 420 is connected to the output terminal of the ring oscillator 410. When an enable signal (EN) at a second input terminal of the AND gate transitions from a low logical level to a high logical level, the ring oscillator 410 oscillates between low and high logical levels. The counter 420 is configured to count the number of oscillations of the ring oscillator 410. The count obtained by the counter 420 is indicative of a voltage detected by the ring oscillator 410.

Figure 5:
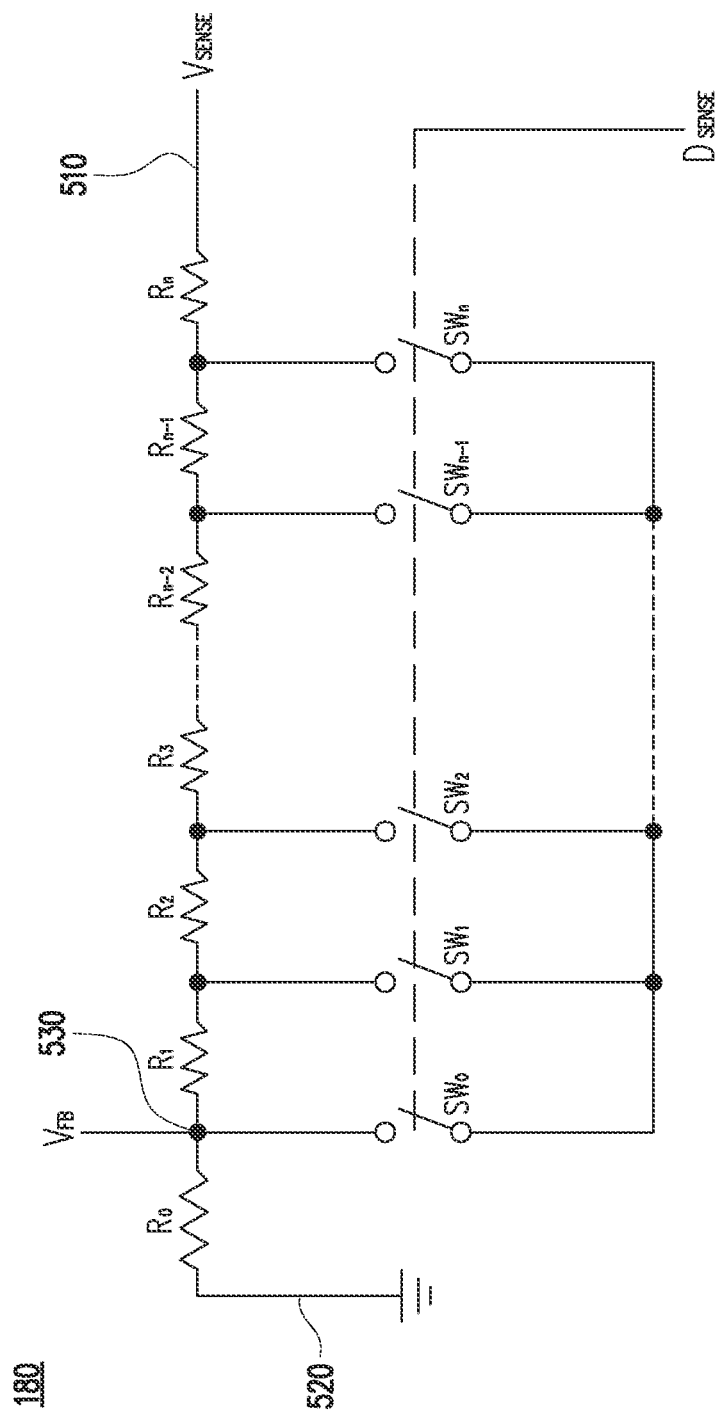
FIG. 5 is a schematic diagram illustrating an exemplary voltage scaler in accordance with various embodiments of the present disclosure.

Example supporting circuitry for the voltage scaler 180 are depicted in FIG. 5. It is understood that this circuitry is provided by way of example, not by limitation, and other suitable voltage scaler 180 circuitry are within the scope of the present disclosure. FIG. 5 is a schematic diagram illustrating an exemplary voltage scaler 180 in accordance with various embodiments of the present disclosure. As illustrated in FIG. 5, the voltage scaler 180 includes a plurality of resistors (R0-Rn) and a plurality of switches (SW0-SWn). The resistors (R0-Rn) are connected in series between a first end 510 that receives the analog sense voltage ($V_{SENSE}$) and a second end 520 that is connected to the electrical ground.

Each switch (SW0-SWn) has first, second, and third switch terminals. The first switch terminal of each switch (SW0-SWn) is connected between a respective adjacent pair of the resistor (R0-Rn). The second switch terminals of the switches (SW0-SWn) are connected to each other. The third switch terminals of the switches (SW0-SWn) are configured to receive the digital sense voltage ($D_{SENSE}$). In some embodiment, each of the switches (SW0-SWn) are in the form of a transistor. Other configurations for the switches (SW0-SWn) are usable in further embodiments. A node 530 between the resistors (R0, R1) outputs the feedback voltage ($V_{FB}$).

Figure 6:
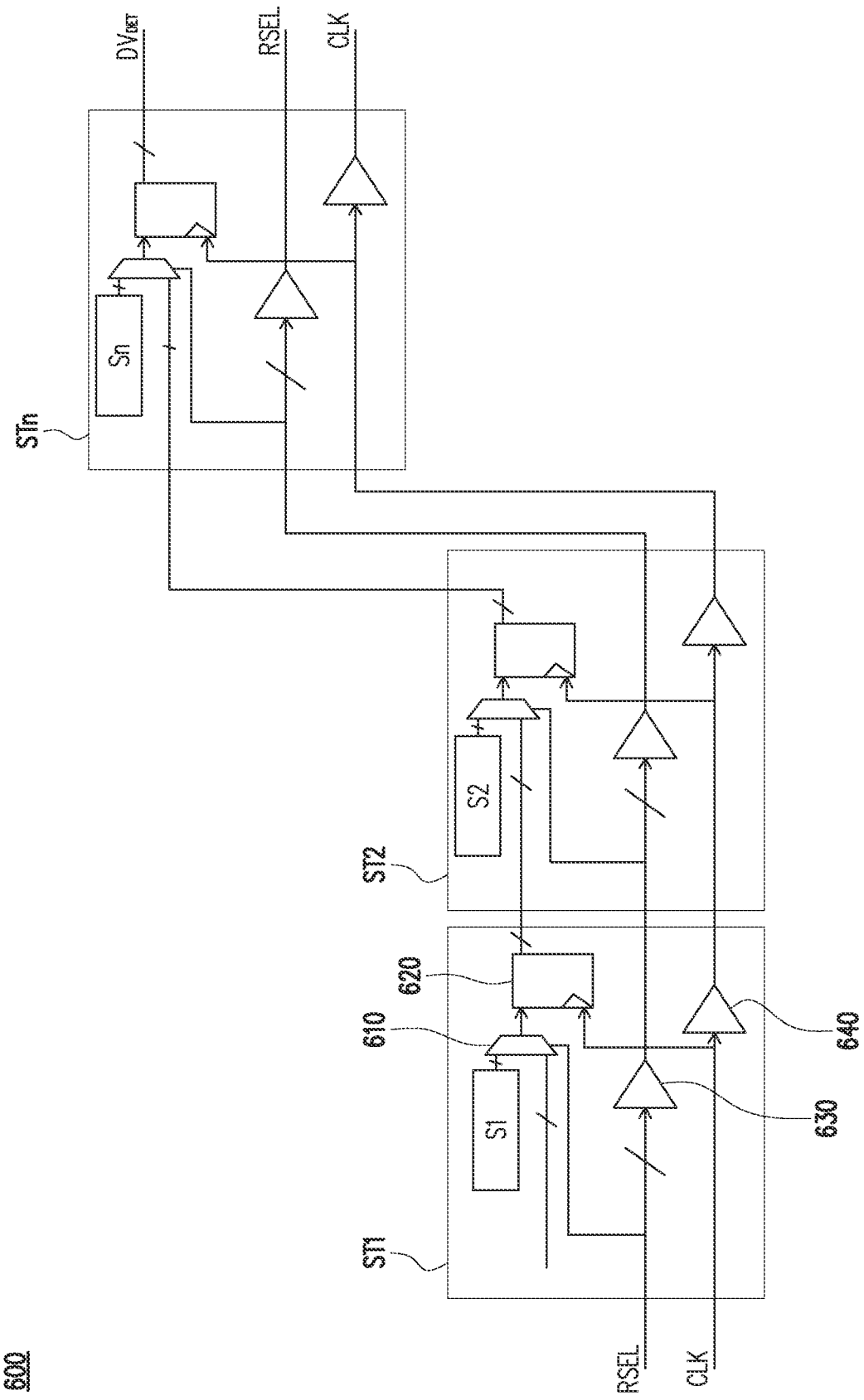
FIG. 6 is a schematic diagram illustrating an exemplary voltage selector in accordance with various embodiments of the present disclosure.

The integrated circuit module 120 further includes a voltage sensor selector that interconnects the voltage sensors (S1-Sn), that selects one of the voltage sensors (S1-Sn), and that outputs the voltage ($DV_{DET}$) detected by the selected one of the voltage sensors (S1-Sn). For example, FIG. 6 is a schematic diagram illustrating an exemplary voltage sensor selector 600 in accordance with various embodiments of the present disclosure. In this exemplary embodiment, the voltage sensor selector 600 connects the voltage sensors (S1-Sn) in series. For example, as illustrated in FIG. 6, the voltage sensor selector 600 includes a plurality of series-connected stages (ST1-STn), each of which includes a multiplexer 610, a flip-flop 620, and a pair of buffers 630, 640 (only the multiplexer 610, the flip-flop 620, and the buffers 630, 640 of the stage ST1 are labeled in FIG. 6). Each multiplexer 610 is connected to a respective voltage sensor (S1-Sn).

From the above, the voltage sensor selector 600 receives a voltage sensor selection signal (RSEL), e.g., from a signal source included in or external to the semiconductor device 200, and a clock signal (CLK), e.g., from a clock generator included in or external to the semiconductor device 200, selects one of the voltage sensors (S1-Sn) in response to the voltage sensor selection signal (RSEL), and outputs a voltage ($DV_{DET}$) detected by the selected one of the voltage sensors (S1-Sn) in response to a rising/falling edge of the clock signal (CLK).

Figure 7:
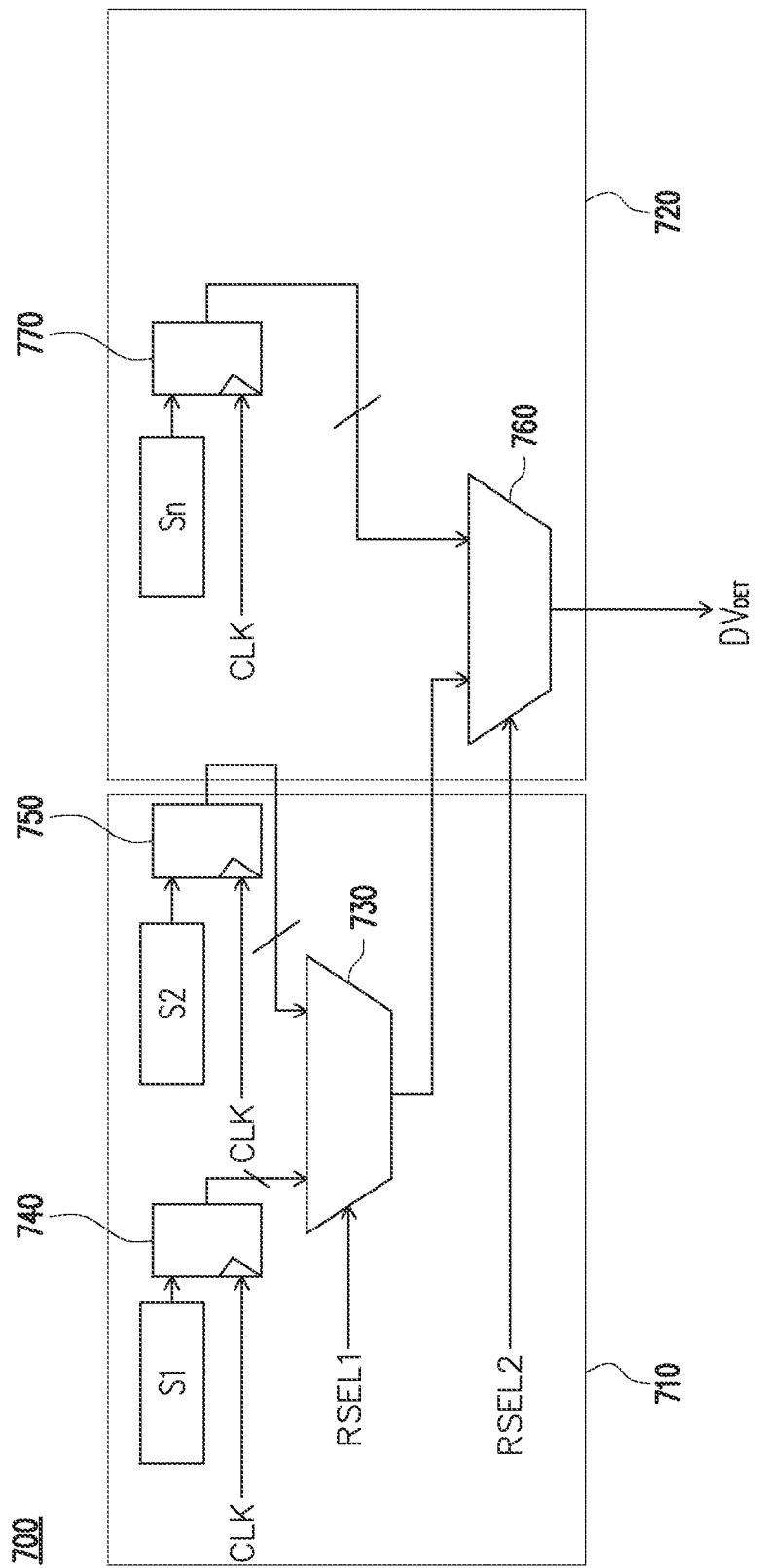
FIG. 7 is a schematic diagram illustrating another exemplary voltage selector in accordance with various embodiments of the present disclosure.

FIG. 7 is a schematic diagram illustrating another exemplary voltage sensor selector 700 in accordance with various embodiments of the present disclosure. The voltage sensor selector 700 of this embodiment differs from the voltage sensor selector 600 in that the voltage sensor selector 700 connects the voltage sensors (S1-Sn) in parallel. For example, as illustrated in FIG. 7, the voltage sensor selector 700 includes a first stage 710 and a plurality of second stages 720 (only one of the second stages 720 is shown in FIG. 7). The first stage 710 includes a multiplexer 730 and a pair of flip-flops 740, 750 connected to multiplexer 730. Each flip-flop 740, 750 is further connected to a respective voltage sensor (S1, S2). The second stage 720 includes a multiplexer 760 connected to the multiplexer 730 and a flip-flop 770 connected to the multiplexer 760. The flip-flop 770 is further connected to the voltage sensor (Sn).

From the above, the voltage sensor selector 700 receives a voltage sensor selection signals (RSEL1, RSEL2), e.g., from a signal source included in or external to the semiconductor device 200, and a clock signal (CLK), e.g., from a clock generator included in or external to the semiconductor device 200, selects one of the voltage sensors (S1-Sn) in response to the voltage sensor selection signals (RSEL1, RSEL2), and outputs a voltage ($DV_{DET}$) detected by the selected one of the voltage sensors (S1-Sn) in response to a rising/falling edge of the clock signal (CLK).

Figure 8:
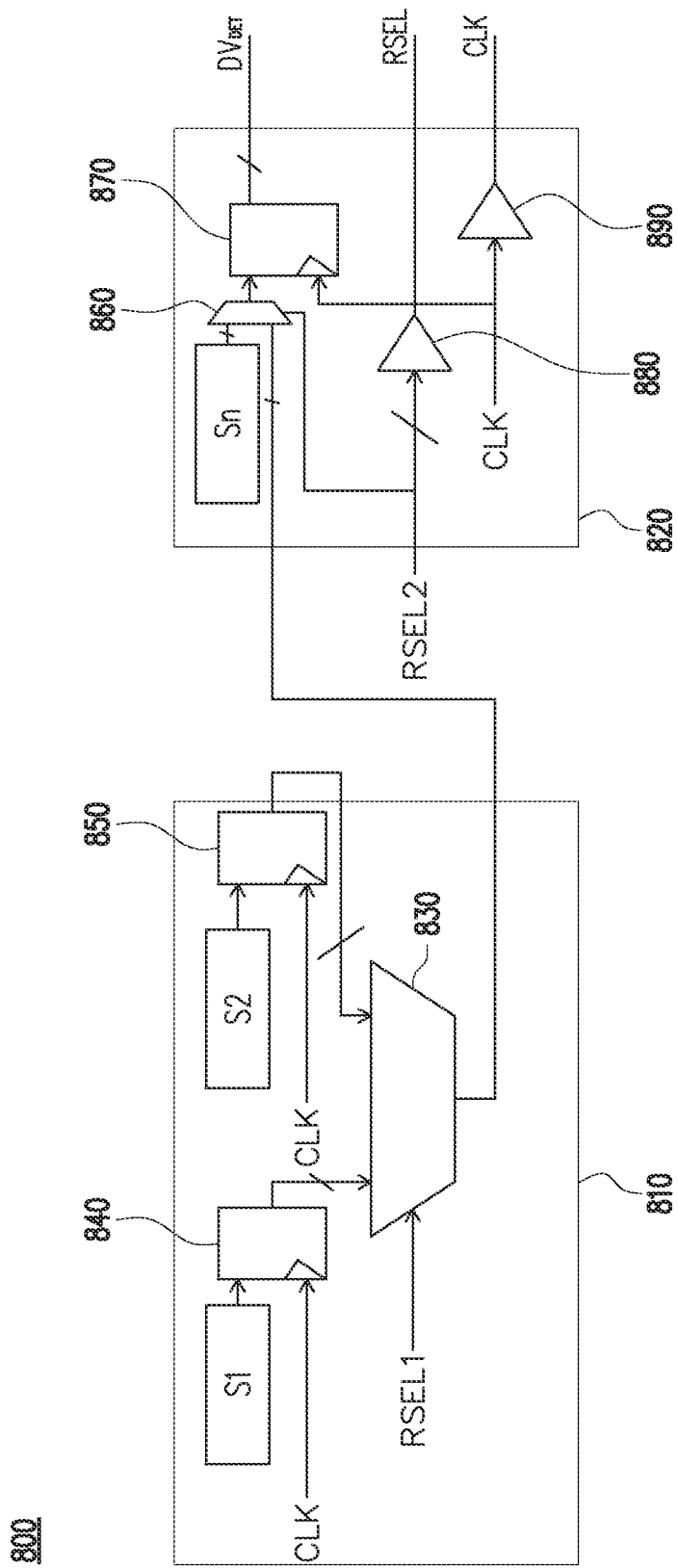
FIG. 8 is a schematic diagram illustrating another exemplary voltage selector in accordance with various embodiments of the present disclosure.

FIG. 8 is a schematic diagram illustrating another exemplary voltage sensor selector 800 in accordance with various embodiments of the present disclosure. The voltage sensor selector 800 of this embodiment differs from the voltage sensor selectors 600, 700 in that the voltage sensor selector 800 connects the voltage sensors (S1-Sn) both in series and parallel. For example, as illustrated in FIG. 8, the voltage sensor selector 800 includes a first stage 810 and a plurality of second stages 820 (only one of the second stages 820 is shown in FIG. 8). The first stage 810 includes a multiplexer 830 and a pair of flip-flops 840, 850 connected to the multiplexer 830. Each flip-flop 840, 850 is further connected to a respective voltage sensor (S1, S2). The second stage 820 includes a multiplexer 860 connected to the multiplexer 830 and a flip-flop 870 connected to the multiplexer 860. The flip-flop 870 is further connected to the voltage sensor (Sn).

From the above, the voltage sensor selector 800 receives a voltage sensor selection signals (RSEL1, RSEL2), e.g., from a signal source included in or external to the semiconductor device 100, and a clock signal (CLK), e.g., from a clock generator included in or external to the semiconductor device 200, selects one of the voltage sensors (S1-Sn) in response to the voltage sensor selection signals (RSEL1, RSEL2), and outputs a voltage ($DV_{DET}$) detected by the selected one of the voltage sensors (S1-Sn) in response to a rising/falling edge of the clock signal (CLK).

Figure 9:
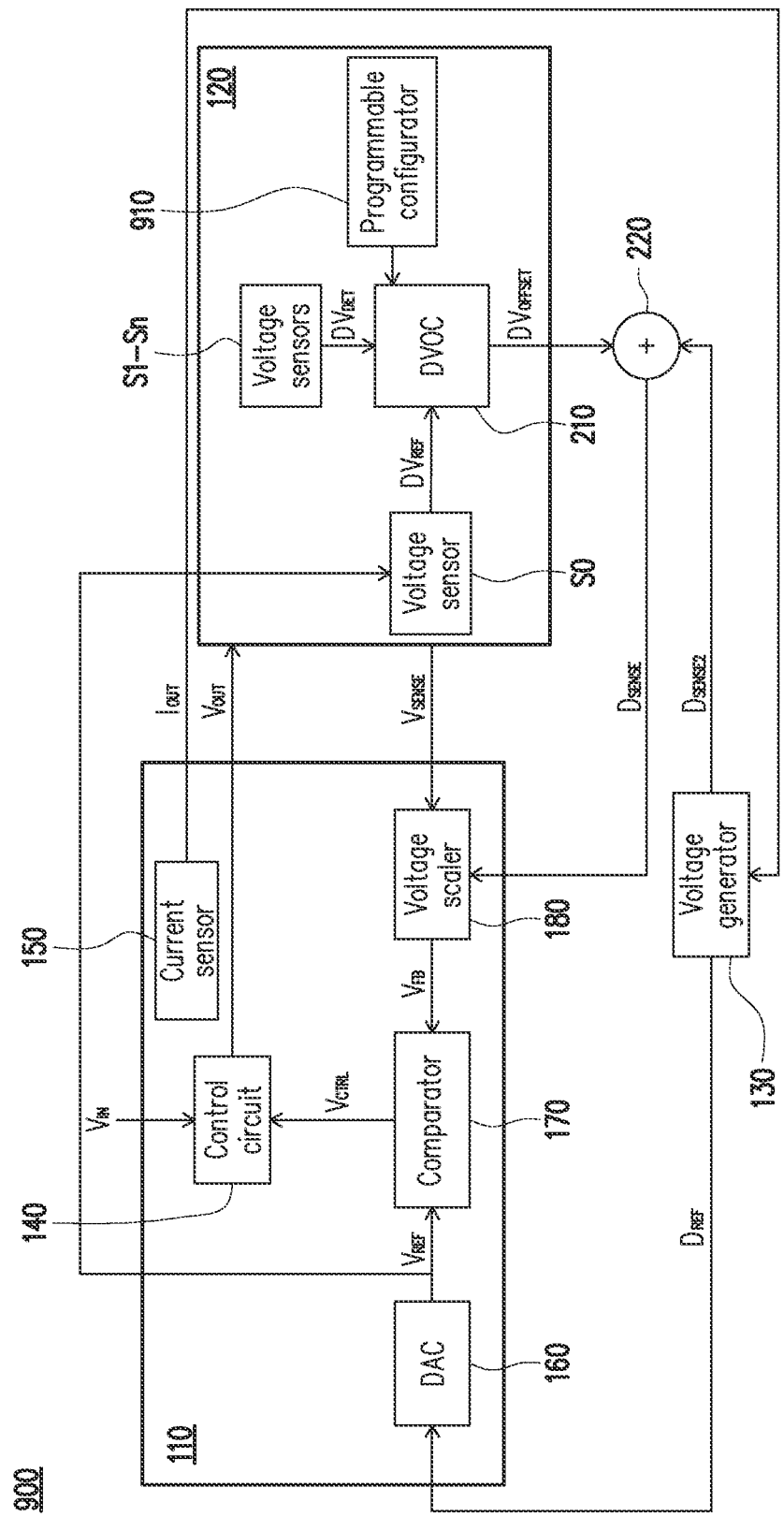
FIG. 9 is a schematic diagram illustrating another exemplary semiconductor device in accordance with various embodiments of the present disclosure.

FIG. 9 is a schematic diagram illustrating another exemplary semiconductor device 900 in accordance with various embodiments of the present disclosure. As illustrated in FIG. 9, the semiconductor device 900 of this embodiment differs from the semiconductor device 200 in that the integrated circuit module 120 further includes a programmable configurator 910 connected to the DVOC 210. The programmable configurator 910 is preset with weighing factors assigned to the voltage sensors (S1-Sn). As such, instead of the voltage selectors 600-800 described above with respect to FIGS. 6-8, a voltage sensor (S1-Sn) may be selected by assigning weighing factors to the voltage sensors (S1-Sn). That is, a weighing factor of "1" may be assigned to the selected one of voltage sensors (S1-Sn) and a weighing factor of "0" may be assigned to the unselected ones of the voltage sensors (S1-Sn). The DVOC 210 receives the voltage ($DV_{DET}$) detected by the selected one of the voltage sensors (S1-Sn) by multiplying the voltages (VDET) detected by the voltage sensors (S1-Sn) with the weighing factors assigned thereto. For example, the voltage ($DV_{DET}$) detected by a selected one of the voltage sensors (S1-Sn) may be obtained by the following equation:

$$DV_{DET} = W_{S1} * V_{DETS1} + W_{S2} * V_{DETS2} \ldots + W_{Sn} * V_{DETSn}$$

where $V_{DETS1}$ is the voltage detected by the voltage sensor (S1), $W_{S1}$ is the weighing factor assigned to the voltage sensor (S1), $V_{DETS2}$ is the voltage detected by the voltage sensor (S2), $W_{S2}$ is the weighing factor assigned to the voltage sensor (S2), $V_{DETSn}$ is the voltage detected by the voltage sensor (Sn), and $W_{S3}$ is the weighing factor assigned to the voltage sensor (Sn).

The integrated circuit module 120 further includes a filter (not shown) that eliminates/reduces the noise from the voltage ($DV_{DET}$) detected by a selected one of the voltage sensors (S1-Sn). In some embodiments, the filter is a low pass filter (LPF), such as a moving average LPF. Other configurations for the filter are usable in further embodiments. Filter parameters associated with the filter are preset in the programmable configurator 910. For example, the filter may be preset to output a moving average in a predetermined period of time, e.g., 1 ms. The DVOC 210 operates the filter based on the filter parameters preset in the programmable configurator 910.

Figure 10:
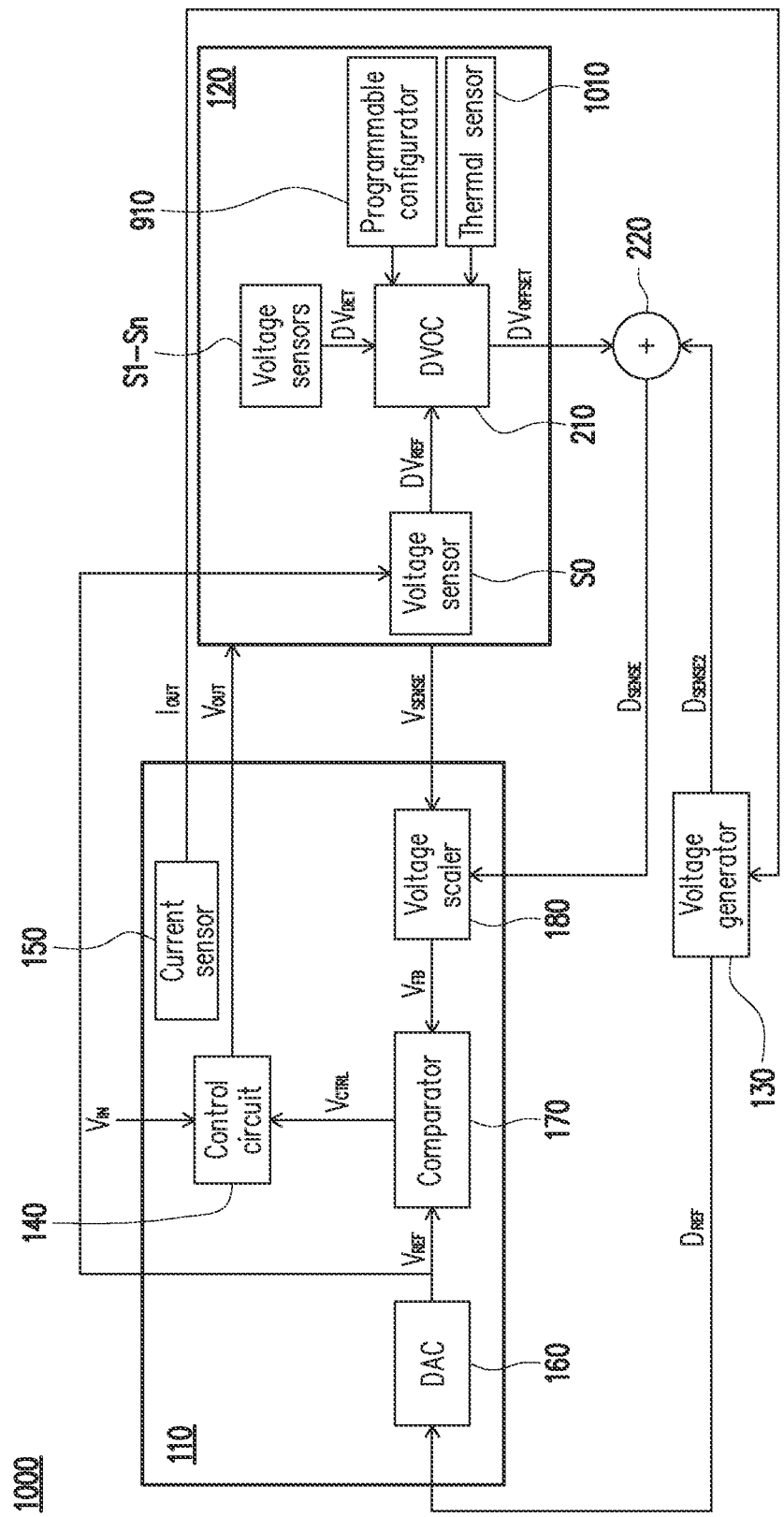
FIG. 10 is a schematic diagram illustrating another exemplary semiconductor device in accordance with various embodiments of the present disclosure.

FIG. 10 is a schematic diagram illustrating another exemplary semiconductor device 1000 in accordance with various embodiments of the present disclosure. As illustrated in FIG. 10, the semiconductor device 1000 of this embodiment differs from the semiconductor device 900 in that the integrated circuit module 120 further includes a thermal sensor 1010 that is connected to the DVOC 210 and that detects a temperature of the integrated circuit module 120. As will be described below, the temperature detected by the thermal sensor 1010 may be used to adjust a voltage ($DV_{DET}$) detected by a selected one of the voltage sensors (S1-Sn). In some embodiments, the thermal sensor 1010 includes a ring oscillator or a thermal diode. Other configurations for the thermal sensor 1010 are usable in further embodiments.

Figure 11:
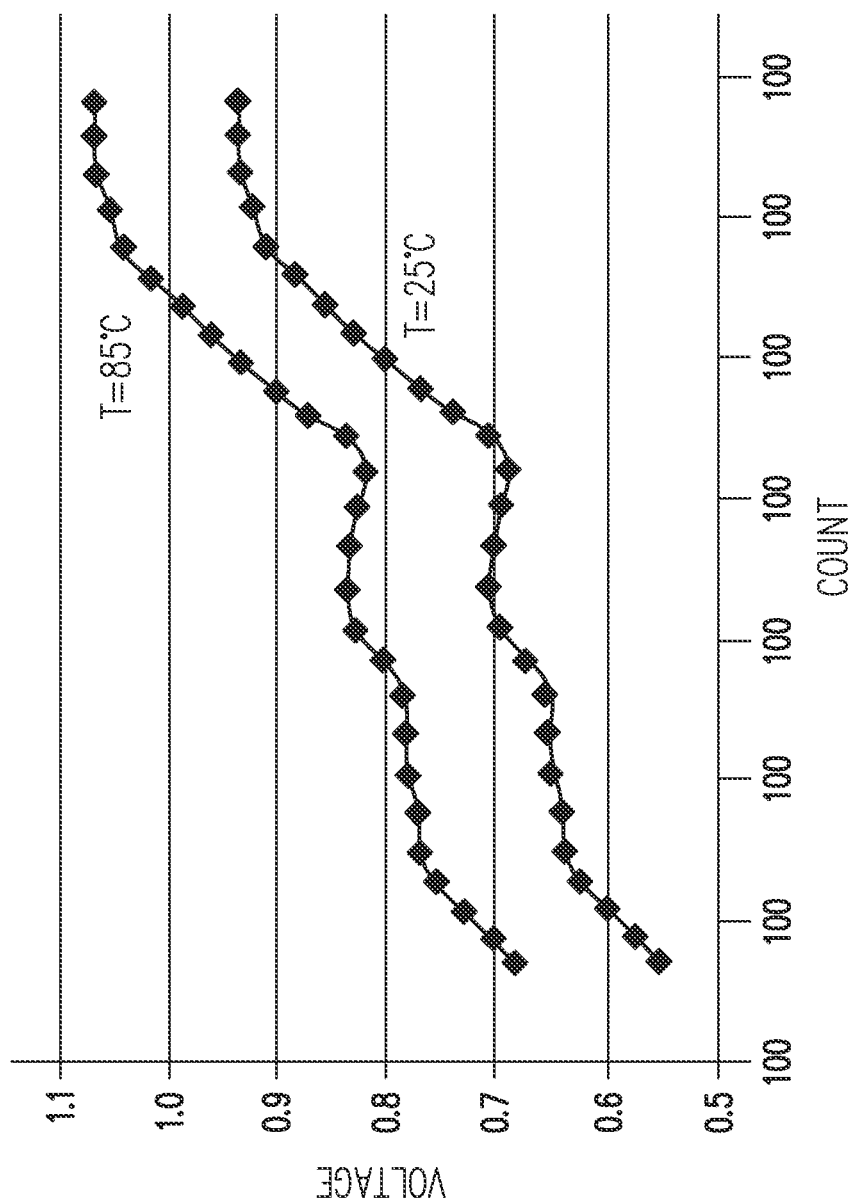
FIG. 11 is a graph illustrating an exemplary relationship among count values, voltage values, and temperature values in accordance with various embodiments of the present disclosure.

The programmable configurator 910 includes a lookup table that stores count values, voltage values, and temperature values. For example, FIG. 11 is a graph illustrating an exemplary relationship among the count values, the voltage values, and the temperature values in accordance with various embodiments of the present disclosure. As illustrated in FIG. 11, the voltage values are correlated with the count values for temperatures at 85° C. and 25° C. The DVOC 210 adjusts the voltage ($DV_{DET}$) detected by a selected one of the voltage sensors (S1-Sn) based on the temperature detected by the thermal sensor 1010 using the lookup table of the programmable configurator 910. For example, with reference to FIG. 11, when the temperature detected by the thermal sensor 1010 is 85° C. and the voltage ($DV_{DET}$) detected by a selected one of the voltage sensors (S1-Sn) is about 400, which is equivalent to about 0.8V, the DVOC 210 adjusts the voltage ($DV_{DET}$) to about 600, which is equivalent to about 0.8V at the 25° C.

Figure 12:
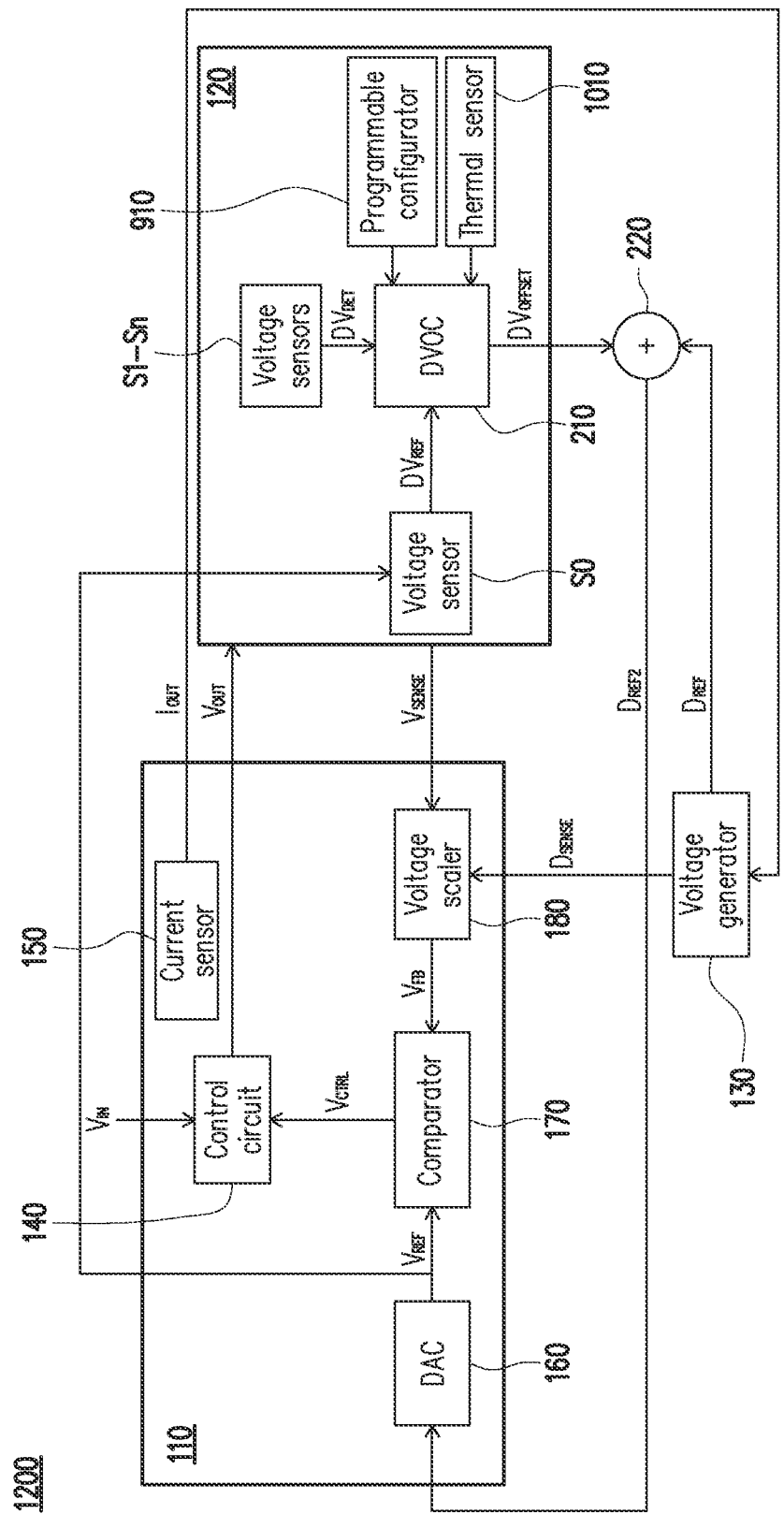
FIG. 12 is a schematic diagram illustrating another exemplary semiconductor device in accordance with various embodiments of the present disclosure.

FIG. 12 is a schematic diagram illustrating another exemplary semiconductor device 1200 in accordance with various embodiments of the present disclosure. As illustrated in FIG. 12, the semiconductor device 1200 of this embodiment differs from the semiconductor device 1000 in that the adder circuit 220 receives the digital offset voltage ($DV_{OFFSET}$) from the DVOC 210 and the predetermined digital reference voltage ($D_{REF}$) from the voltage generator 130 and generates a digital reference voltage ($D_{REF2}$) based on the digital offset voltage ($DV_{OFFSET}$) and the predetermined digital reference voltage ($D_{REF}$) received thereby. For example, the digital reference voltage ($D_{REF2}$) is substantially equal to the sum of the digital offset voltage ($DV_{OFFSET}$) and the predetermined digital reference voltage ($D_{REF}$). In one or more embodiments, the digital reference voltage ($D_{REF2}$) is substantially equal to the digital reference voltage ($DV_{REF}$).

The voltage generator 130 receives the output current ($I_{OUT}$) from the current sensor 150 and converts the output current ($I_{OUT}$) received thereby into a digital sense voltage ($D_{SENSE}$). The voltage scaler 180 receives the analog sense voltage ($V_{SENSE}$) from the integrated circuit module 120 and the digital sense voltage ($D_{SENSE}$) from the voltage generator 130 and generates a feedback voltage ($V_{FB}$) based on the analog sense voltage ($V_{SENSE}$) and the digital sense voltage ($D_{SENSE}$) received thereby. For example, with further reference to FIG. 5, depending on the value of digital sense voltage ($V_{SENSE}$), one or more of the switches (SW0-SWn) are closed/opened. This connects/disconnects one or more of the resistors (R1-Rn) to the node 530. This, in turn, divides the analog sense voltage ($V_{SENSE}$), resulting in the feedback voltage ($V_{FB}$). The feedback voltage ($V_{FB}$) may be a fraction of the analog sense voltage ($V_{SENSE}$). The DAC 160 receives the digital reference voltage ($D_{REF2}$) from the adder circuit 220 and converts the digital reference voltage ($D_{REF2}$) received thereby into the analog reference voltage ($V_{REF}$). The comparator 170 receives the feedback voltage ($V_{FB}$) from the voltage scaler 180 and the analog reference voltage ($V_{REF}$) from the DAC 160 and generates the control voltage ($V_{CTRL}$) based on the feedback voltage ($V_{FB}$) and the analog reference voltage ($V_{REF}$) received thereby. That is, the comparator compares the feedback voltage ($V_{FB}$) with the analog reference voltage ($V_{REF}$) and obtains the control voltage ($V_{CTRL}$). The control voltage ($V_{CTRL}$) is adjusted until the feedback voltage ($V_{FB}$) and the analog reference voltage ($V_{REF}$) are substantially equal.

Figure 13:
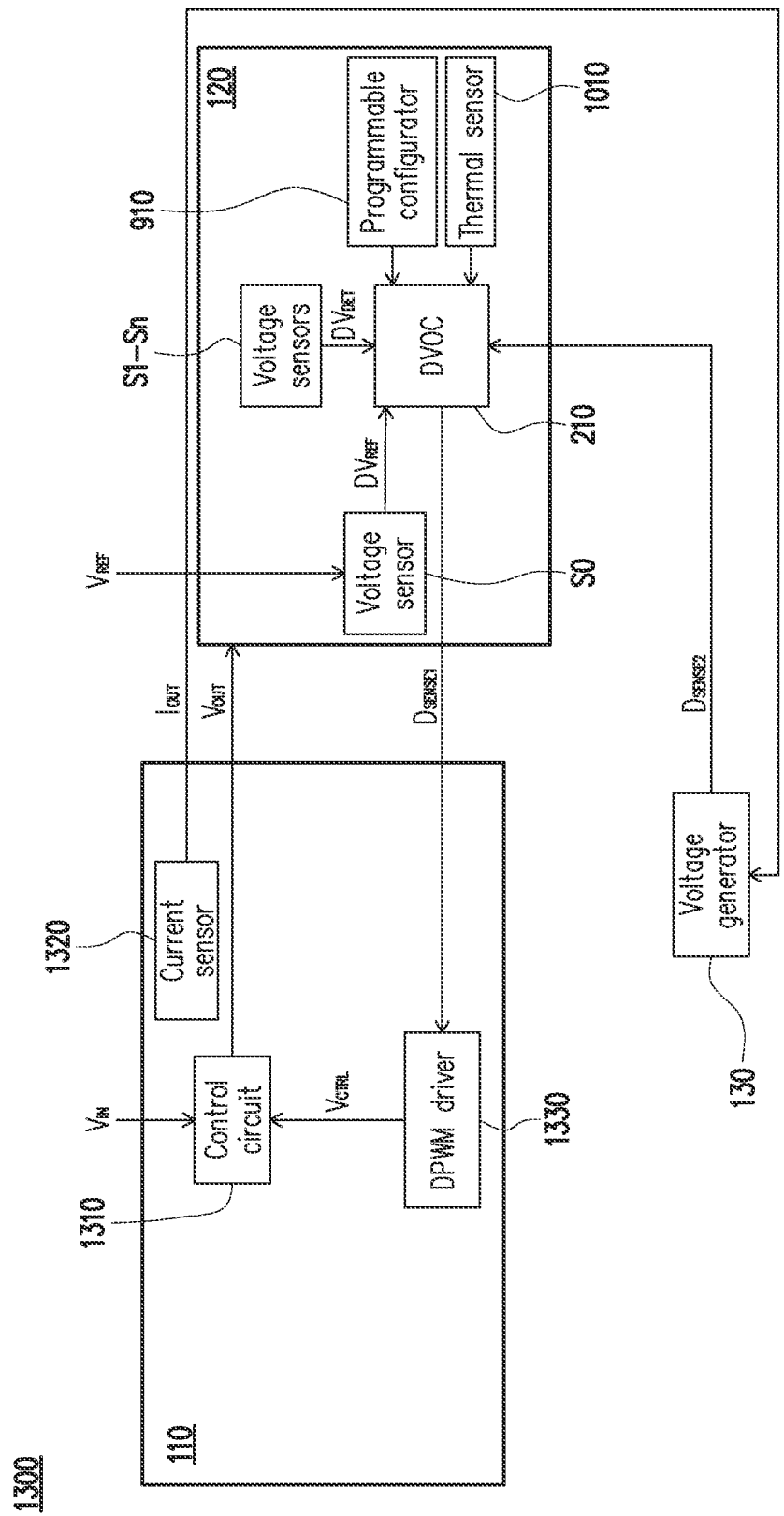
FIG. 13 is a schematic diagram illustrating another exemplary semiconductor device in accordance with various embodiments of the present disclosure.

FIG. 13 is a schematic diagram illustrating another exemplary semiconductor device 1300 in accordance with various embodiments of the present disclosure. As illustrated in FIG. 13, the semiconductor device 1300 of this embodiment differs from the semiconductor device 1000 in that the voltage regulator 110 is a digital voltage regulator and includes a control circuit 1310, a current sensor 1320, and a digital pulse width modulation (DPWM) driver 1330.

The voltage sensor (S0) receives an analog reference voltage ($V_{REF}$), e.g., from a voltage source included in or external to the semiconductor device 1300, and converts the analog reference voltage ($V_{REF}$) received thereby into a digital reference voltage ($DV_{REF}$). The voltage generator 130 receives the output current ($I_{OUT}$) from the current sensor 1320 and converts the output current ($I_{OUT}$) received thereby into a digital sense voltage ($D_{SENSE2}$). The DVOC 210 receives the digital reference voltage ($DV_{REF}$) from the voltage sensor (S0), the voltage ($DV_{DET}$) detected by a selected one of the voltage sensors (S1-Sn), the digital sense voltage ($D_{SENSE2}$) from the voltage generator 130, and generates a digital sense voltage ($D_{SENSE1}$) based on the digital reference voltage ($DV_{REF}$), the voltage ($DV_{DET}$), and the digital sense voltage ($D_{SENSE2}$) received thereby. For example, when the digital sense voltage ($D_{SENSE2}$) increases, i.e., when the output current ($I_{OUT}$) increases, a duty cycle of the digital sense voltage ($D_{SENSE1}$) also increases. The difference between the voltage ($DV_{DET}$) and the digital reference voltage ($DV_{REF}$) adjusts to lower the duty cycle of the duty cycle of the digital sense voltage ($D_{SENSE1}$). For example, the larger/smaller the difference between the voltage ($DV_{DET}$) and the digital reference voltage ($DV_{REF}$), the smaller/larger the duty cycle of the digital sense voltage ($D_{SENSE1}$). The duty cycle of the digital sense voltage ($D_{SENSE1}$) is adjusted until the voltage ($DV_{DET}$) and the digital reference voltage ($D_{VREF}$) are substantially equal.

The DPWM driver 1330 receives the digital sense voltage ($D_{SENSE1}$) from the DVOC 210 and generates a control voltage ($V_{CTRL}$) based on the digital sense voltage ($D_{SENSE2}$) received thereby. For example, when the regulated output voltage ($V_{OUT}$) tends to increase, the DPWM driver 1330 outputs a control voltage ($V_{CTRL}$) that has a lower duty cycle. This causes the control circuit 1310 to decrease the regulated output voltage ($V_{OUT}$). On the other hand, when the regulated output voltage ($V_{OUT}$) tends to decrease, the DPWM driver 1330 outputs a control voltage ($V_{CTRL}$) that has a higher duty cycle. This causes the control circuit 1310 to increase the regulated output voltage ($V_{OUT}$).

Figure 14:
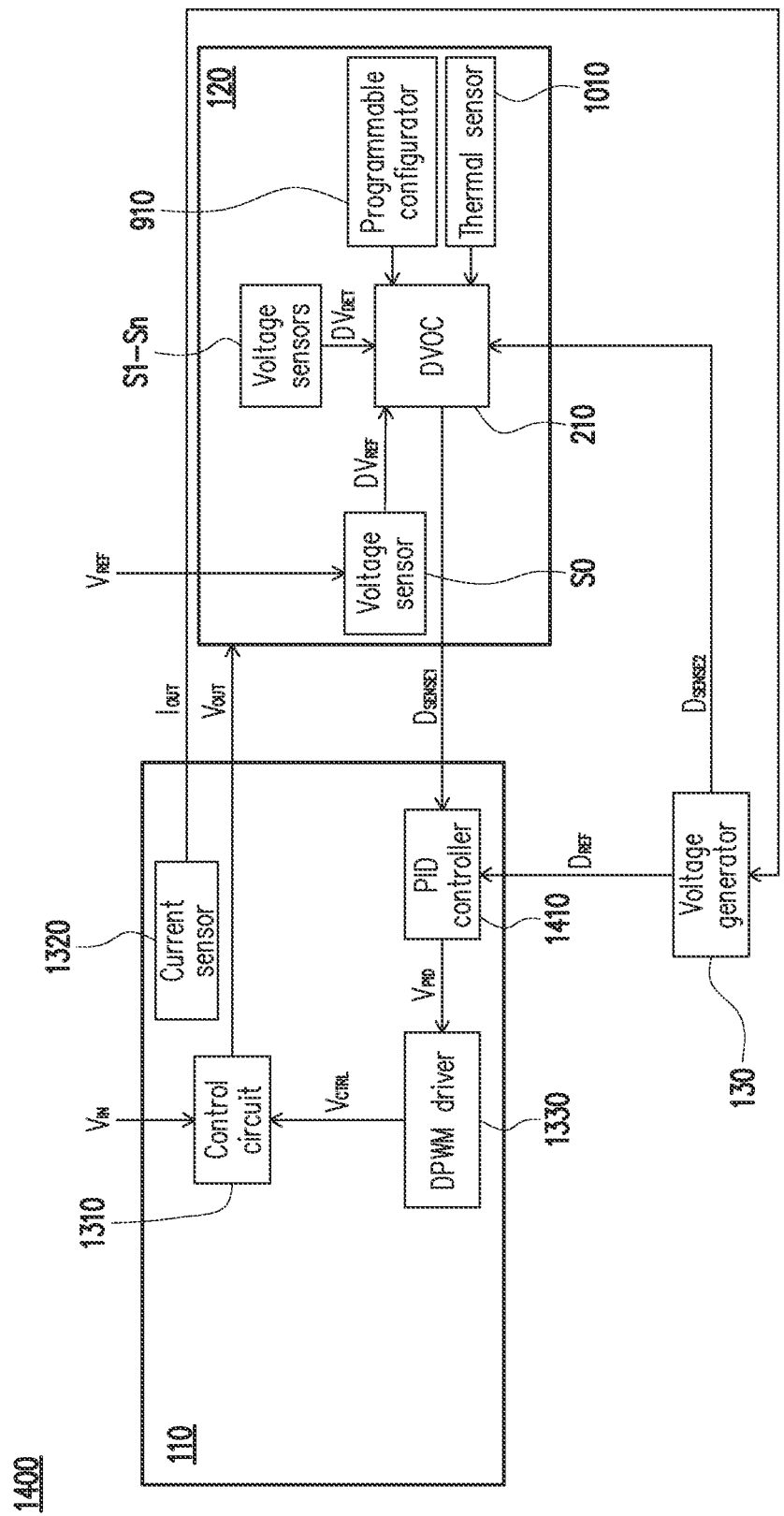
FIG. 14 is a schematic diagram illustrating another exemplary semiconductor device in accordance with various embodiments of the present disclosure.

FIG. 14 is a schematic diagram illustrating another exemplary semiconductor device 1400 in accordance with various embodiments of the present disclosure. As illustrated in FIG. 14, the semiconductor device 1400 of this embodiment differs from the semiconductor device 1300 in that the voltage regulator 110 further includes a proportional, integral, and derivative (PID) controller 1410.

The voltage generator 130 generates a predetermined digital reference voltage ($D_{REF}$). In one or more embodiments, the predetermined digital reference voltage ($D_{REF}$) is substantially equal to the digital reference voltage ($DV_{REF}$). The PID controller 1410 receives the digital sense voltage ($D_{SENSE1}$) from the DVOC 210 and the predetermined digital reference voltage ($D_{REF}$) from the voltage generator 130 and generates a digital PID voltage ($V_{PID}$) based on the digital sense voltage ($D_{SENSE1}$) and the predetermined digital reference voltage ($D_{REF}$) received thereby. For example, the PID controller 1410 obtains a proportional value, an integral value, and a derivative value of the difference between the digital sense voltage ($D_{SENSE1}$) and the predetermined digital reference voltage ($D_{REF}$) and adds the three values obtained thereby to output the digital PID voltage ($V_{PID}$).

The DPWM driver 1330 receives the digital PID voltage ($V_{PID}$) from the PID controller 1410 and generates a control voltage ($V_{CTRL}$) based on the digital PID voltage ($V_{PID}$) received thereby.

Figure 15:
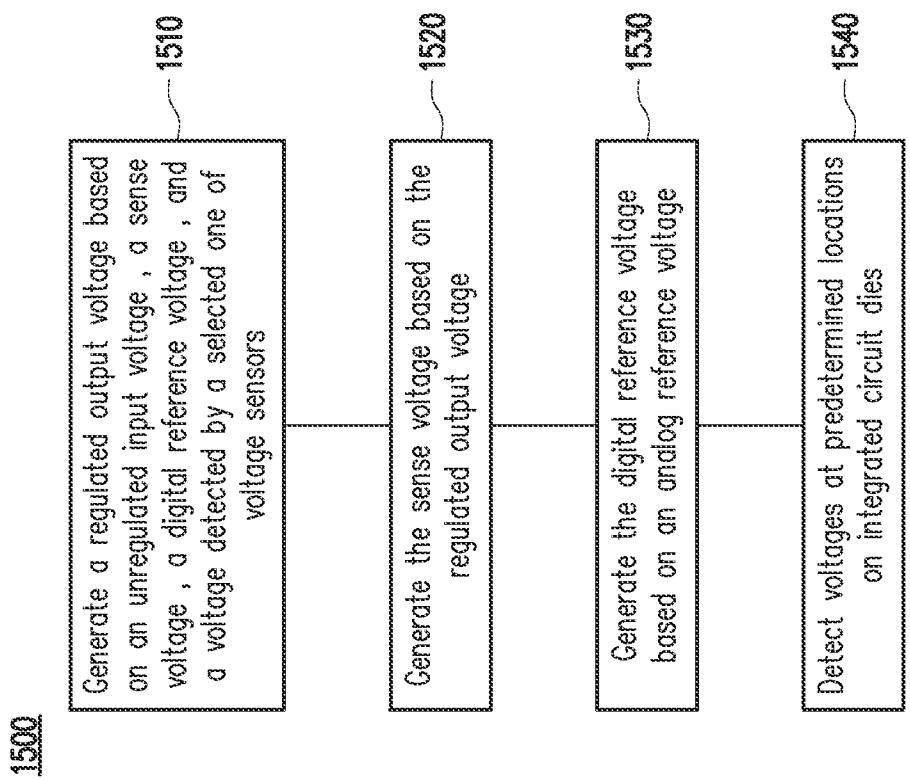
FIG. 15 is a flow chart illustrating an exemplary method of operating a semiconductor device in accordance with various embodiments of the present disclosure.

FIG. 15 is a flow chart illustrating an exemplary method 1500 of operating a semiconductor device 200-1400 in accordance with various embodiments of the present disclosure. Method 1500 will now be described with further reference to FIGS. 2-14 for ease of understanding. It is understood that method 1500 is applicable to structures other than those of FIGS. 2-14. Further, it is understood that additional operations can be provided before, during, and after method 1500, and some of the operations described below can be replaced or eliminated, in an alternative embodiment of method 1500.

In operation 1510, the voltage regulator 110 generates a regulated output voltage ($V_{OUT}$) based on an unregulated input voltage ($V_{IN}$), a sense voltage ($V_{SENSE}$, $D_{SENSE1}$), a digital reference voltage ($DV_{REF}$), and a voltage ($DV_{DET}$) detected by a selected one of voltage sensors (S1-Sn). In some embodiments, the sense voltage ($V_{SENSE}$) is an analog sense voltage. In other embodiments, the sense voltage ($D_{SENSE1}$) is a digital sense voltage.

In operation 1520, the DVOC 210 generates the sense voltage ($V_{SENSE}$, $D_{SENSE1}$) based on the regulated output voltage ($V_{OUT}$).

In operation 1530, the voltage sensor (S0) generates the digital reference voltage ($DV_{REF}$) based on an analog reference voltage ($V_{REF}$). In some embodiments, the analog reference voltage ($V_{REF}$) is generated by the voltage regulator 110 of the semiconductor device 200-1200. In other embodiments, the analog reference voltage ($V_{REF}$) is generated by a voltage source included in or external to the semiconductor device 1300, 1400.

In operation 1540, the voltage sensors (S1-Sn) detect voltages at predetermined locations on integrated circuit dies (D0-Dn). In certain embodiments, operation 1540 includes filtering the noise in the voltage ($DV_{DET}$) detected by a selected one of the voltage sensors and/or adjusting the voltage ($DV_{DET}$) detected by a selected one of the voltage sensors based on a temperature of the integrated circuit dies (D0-Dn) detected by the thermal sensor 1010 using a lookup table of the programmable configurator 910.

In an embodiment, a semiconductor device comprises an analog voltage regulator and an integrated circuit module. The analog voltage regulator is configured to generate an analog reference voltage and a regulated output voltage. The integrated circuit module is configured to generate an analog sense voltage based on the regulated output voltage and includes a plurality of integrated circuit dies, a first sensor, a plurality of second sensors, and a digital voltage offset controller (DVOC). The first sensor is configured to generate a digital reference voltage based on the analog reference voltage. The second voltage sensors are configured to detect voltages at predetermined locations on the integrated circuit dies. The DVOC is configured to generate a digital offset voltage substantially equal to the difference between the digital reference voltage and the voltage detected by a selected one of the second voltage sensors. The regulated output voltage is based on an unregulated input voltage, the analog sense voltage, and the digital offset voltage.

In another embodiment, a semiconductor device comprises a digital voltage regulator and an integrated circuit module. The digital voltage regulator is configured to generate a regulated output voltage. The integrated circuit module includes a plurality of integrated circuit dies, a first voltage sensor, a plurality of second voltage sensors, and a digital voltage offset controller (DVOC). The first voltage sensor is configured to generate a digital reference voltage based on an analog reference voltage. The second voltage sensors are configured to detect voltages at predetermined locations on the integrated circuit dies. The DVOC is configured to generate a digital sense voltage based on the digital reference voltage and the voltage detected by a selected one of the voltage sensors. The regulated output voltage is based on an unregulated input voltage and the digital sense voltage.

In another embodiment, a method includes steps of generating a regulated output voltage based on an unregulated input voltage, a sense voltage, a digital reference voltage, and a voltage detected by a selected one of voltage sensors; generating the sense voltage based on the regulated output voltage; generating the digital reference voltage based on an analog reference voltage; and the voltage sensors detecting voltages at predetermined locations on integrated circuit dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    an analog voltage regulator configured to generate an analog reference voltage and a regulated output voltage; and
    an integrated circuit module configured to generate an analog sense voltage based on the regulated output voltage, the integrate circuit module including:
        a plurality of integrated circuit dies;
        a first sensor configured to generate a digital reference voltage based on the analog reference voltage;
        a plurality of second voltage sensors configured to detect voltages at predetermined locations on the integrated circuit dies; and
        a digital voltage offset controller (DVOC) configured to generate a digital offset voltage substantially equal to the difference between the digital reference voltage and the voltage detected by a selected one of the second voltage sensors, wherein the regulated output voltage is based on an unregulated input voltage, the analog sense voltage, and the digital offset voltage.

2. The semiconductor device of claim 1, further comprising:
    a voltage generator configured to generate a first digital sense voltage based on an output current from the analog voltage regulator; and
    an adder circuit configured to generate a second digital sense voltage substantially equal to the sum of the digital offset voltage and the first digital sense voltage.

3. The semiconductor device according to claim 2, wherein the analog voltage regulator comprises a voltage scaler configured generate a feedback voltage based on the analog sense voltage and the second digital sense voltage, wherein the regulated output voltage is based further on the feedback voltage.

4. The semiconductor device of claim 1, further comprising a voltage generator configured to generate a predetermined digital reference voltage, wherein the regulated output voltage is based further on the predetermined digital reference voltage.

5. The semiconductor device according to claim 4, wherein the analog voltage regulator comprises a digital-to-analog converter (DAC) configured to generate the analog reference voltage based on the predetermined digital reference voltage, wherein the regulated output voltage is further based on the analog reference voltage.

6. The semiconductor device of claim 1, further comprising a voltage generator configured to generate a digital sense voltage based on an output current from the analog voltage regulator, wherein the regulated output voltage is further based on the digital sense voltage.

7. The semiconductor device according to claim 6, wherein the analog voltage regulator comprises a voltage scaler configured generate a feedback voltage based on the analog sense voltage and the digital sense voltage, wherein the regulated output voltage is based further on the feedback voltage.

8. The semiconductor device of claim 1, wherein the integrated circuit module is a three-dimensional integrated circuit (3DIC) module.

9. The semiconductor device of claim 1, wherein the integrated circuit module further includes a voltage sensor selector that connects that voltage sensors in at least one of series and parallel.

10. The semiconductor device of claim 1, wherein the integrated circuit module further includes a programmable configurator preset with weighing factors assigned to voltages detected by the voltage sensors and the DVOC is configured to multiply the voltages detected by the voltages with the weighing factors assigned thereto.

11. The semiconductor device of claim 1, wherein the integrated circuit module further includes:
a filter configured to remove noise from the voltage detected by the selected one of the voltage sensors; and
a programmable configurator preset with filter parameters associated with the filter, wherein the DVOC is configured to operate the filter based on the filter parameters in the programmable configurator.

12. The semiconductor device of claim 1, wherein the integrated circuit module further includes:
a thermal sensor configured to detect a temperature of the integrated circuit module; and
a programmable configurator including a lookup table that stores count values, voltage values, and temperature values, wherein the DVOC is configured to adjust the voltage detected by the selected one of the voltage sensors based on the temperature detected by the thermal sensor using the lookup table of the programmable configurator.

13. The semiconductor device according to claim 1, wherein each second voltage sensor comprises a ring oscillator and a counter.

14. A method comprising:
generating a regulated output voltage based on an unregulated input voltage, a sense voltage, a digital reference voltage, and a voltage detected by a selected one of voltage sensors;
generating the sense voltage based on the regulated output voltage;
generating the digital reference voltage based on an analog reference voltage; and
the voltage sensors detecting voltages at predetermined locations on integrated circuit dies.

15. The method of claim 14, further comprising adjusting the voltage detected by the selected one of the voltage sensors based on a temperature of the integrated circuit dies.

16. The method of claim 14, further comprising filtering noise from the voltage detected by the selected one of the voltage sensors.

17. The method according to claim 14, further comprising generating a digital offset voltage substantially equal to the difference between the digital reference voltage and the voltage.

18. The method according to claim 17, further comprising generating the sense voltage based on the digital offset voltage and an output current from a current sensor.

19. The method according to claim 14, further comprising generating the sense voltage based on an output current from a current sensor.

20. The method according to claim 14, further comprising generating a predetermined digital reference voltage based on an output current from a current sensor, wherein the regulated output voltage is further based on the predetermined digital reference voltage.

* * * * *